(12) United States Patent
Haraguchi et al.

(10) Patent No.: US 6,642,533 B2
(45) Date of Patent: Nov. 4, 2003

(54) SUBSTRATE DETECTING METHOD AND DEVICE

(75) Inventors: Hideo Haraguchi, Toyonaka (JP);
Izuru Matsuda, Ibaraki (JP);
Shigeyuki Yamamoto, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 299 days.

(21) Appl. No.: 09/768,065

(22) Filed: Jan. 24, 2001

(65) Prior Publication Data

US 2001/0009641 A1 Jul. 26, 2001

(30) Foreign Application Priority Data

Jan. 25, 2000 (JP) ........................................ 2000-015968

(51) Int. Cl.[7] .............................................. G01N 21/62
(52) U.S. Cl. ........................... 250/559.33; 250/559.36; 414/936; 414/937
(58) Field of Search ............................ 250/559.33, 234, 250/551, 559.29, 559.36; 414/937, 936, 416.03, 217

(56) References Cited

U.S. PATENT DOCUMENTS

| | | | | |
|---|---|---|---|---|
| 5,239,182 A | * | 8/1993 | Tateyama et al. | 250/559.37 |
| 6,013,920 A | * | 1/2000 | Gordon et al. | 250/559.36 |
| 6,452,201 B1 | * | 9/2002 | Wang et al. | 250/559.29 |

* cited by examiner

Primary Examiner—Edward J. Glick
Assistant Examiner—Hoon Song
(74) Attorney, Agent, or Firm—Greenblum & Bernstein, P.L.C.

(57) ABSTRACT

A substrate detection sensor is operatively connected to a door moving mechanism for opening/closing a front door with respect to a sealed container accommodating therein a plurality of substrates. The substrate detection sensor enters the sealed container and detects the substrates successively as it is lowered integrally with the front door, and retracts from the sealed container when all of the substrates have been detected.

17 Claims, 4 Drawing Sheets

SUBSTRATE DETECTING METHOD AND DEVICE

BACKGROUND OF THE INVENTION

The present disclosure relates to subject matter contained in priority Japanese Patent Application No. 2000-015968, filed on Jan. 25, 2000, the contents of which is herein expressly incorporated by reference in its entirety.

1. Technical Field of the Invention

The present invention relates to a method and a device for detecting substrates accommodated and transferred in a sealed container in the manufacture of thin film devices or magnetic heads that constitute semiconductor elements, liquid display panels, solar cells, and the like.

More particularly, the present invention relates to such systems enabling detection of the presence and position of each of a plurality of substrates, to which thin film forming processes are to be performed, within the sealed container. Throughout this disclosure, the term "substrate" will be used for purposes of consistency to refer to planar substrates such as silicon wafers and glass flat panes, but it will be understood that it is intended to be used in the broad context so as to be applicable to all substrates.

2. Description of Related Art

Vigorous efforts are being made to enable more precise, accelerated processes for substrates of larger size, for cost effective, high-yielding and profitable manufacturing of thin film devices. While stringent control of particulate contamination is imperative for further miniaturization of thin film devices, it is not desirable that "clean rooms" be established with a large, complex design, because the equipment cost will rise accordingly. For that reason, it has been known to employ a sealed container or pod for maintaining substrates such as wafers fairly clean within a substantially particle free environment and for storing and transferring the substrates in a sealed condition from one to another of various processing stations in a substrate transfer system generally referred to as a "mini-environment". More recently, these containers are of the FOUP (Front Opening Unified Pod) design intended to carry semiconductor wafers sized to a diameter of 300 mm. The substrate transfer system using such FOUP type containers, wherein only the interior of the containers are maintained particle free, is fairly advantageous because it does not require a bulky clean room, while being able to transfer the wafers in a highly clean environment.

The sealed container of the FOUP design has in its interior a desired number of rack members for supporting the wafers generally horizontally, in a generally vertically spaced relationship. When the sealed container is moved to a predetermined position within a film forming apparatus, its front door is opened, and prior to the removal of the substrates therein, sensors inform whether each of the substrates is present, and whether the substrates are properly positioned in their respective rack members. This detection of the presence and position of substrates is conducted for the purpose of accommodating the substrates properly back in their original places and positions after a film forming operation has been performed to the substrates.

The sealed containers of the FOUP design are typically provided as two standard sizes: a smaller size that holds thirteen wafers and a larger size that holds twenty-five wafers. In a processing system, several such FOUP type sealed containers are loaded in a predetermined positional relationship with a film forming apparatus.

With reference to FIG. 4, when the sealed containers 1 are brought in a parallel arrangement with each other at predetermined locations, their front doors (not shown) are horizontally moved toward the film forming apparatus (not shown) side by means of a door removing mechanism (not shown) generally referred to as a "FOUP front opener", whereby the containers 1 are opened to provide access to the interior thereof. A wafer handling robot 4 that faces the sealed containers 1 holds wafers 2 with its blades 3 and transfers them into a film forming station, as well as brings back the processed wafers 2 and stores them in their original places and positions within the container 1. The wafer handling robot 4 is moved along transfer rails 7 and brought to a position facing one of the sealed containers 1 of which front door has just been opened.

The sensing of substrates within the sealed container was conventionally accomplished in such a manner as described below. A reflection sensor 9 is attached on the opposite side of the blade 3 of the wafer handling robot 4, and when the wafer handling robot 4 is positioned in front of the opening of the sealed container 1, the blade 3 is rotated at 180 degrees by operating a plurality of (four in the illustrated example) arms 8 of a link mechanism, so that the reflection sensor 9 faces the opening of the sealed container 1 as shown in the drawing. The wafer handling robot 4 is designed to be capable of positioning the reflection sensor 9 in relation to each of the wafers 2 within the container 1, using the arms 8. The reflection sensor 9 is first positioned so as to face an uppermost wafer 2 in the container 1.

In this state, a detection circuit built in the wafer handling robot 4 activates the reflection sensor 9, and determines the presence of the wafer 2 in its rack member based on the result whether a spot light projected from the reflection sensor has been reflected by the wafer. The wafer handling robot 4 is lowered intermittently in a certain pitch space corresponding to the intervals between the vertically spaced rack members in the container 1, and detects the presence of the wafers 2 in each of the rack members in succession from top to bottom. When the wafer handling robot 4 has completed its detecting operation, it rotates its arms 8 at 180 degrees so that the wafer transfer blade 3 faces the wafers 2, and rises to a position where the wafer transfer blade 3 comes opposite the uppermost wafer 2 in the container 1, after which the wafer 2 is removed from the container and carried toward a processing system.

As described above, according to the conventional substrate detecting method, the wafer handling robot 4, which is intended to be used for inserting and removing substrates to/from the container 1, is doubled as the means for detecting the substrates. There is normally provided only one such wafer handling robot 4 in a processing system, where there are often a plurality of sealed containers 1 located in their respective predetermined positions. Therefore, until after all of the wafers 2 in one container have been inserted or removed to/from the container, detection of wafers 2 in other containers cannot be commenced. Life of the entire substrate handling system is shortened because the wafer handling robot 4 cannot withstand the demanding work for the both purposes of transferring and detecting the substrates. With such substrate transfer system with only one wafer handling robot, when a large number of containers 1 are provided, the transferring efficiency of substrates becomes extremely low, and troubles are more likely to occur. Furthermore, defects may be formed on thin films on the substrates due to dust which is attributable to the rough use of the substrate handling system.

Also, in order to make the wafer handling robot 4 double as the means for detecting substrates in addition to its intended use for transferring substrates, it is necessary to provide a large number of drive shafts and other mechanisms to the robot for enabling complex movements, for which its internal structure becomes complex, the cost high, and the reliability low.

Another problem is that the reflection sensors sometimes make an error especially when the rack members in the container 1 are out of position even slightly because of a dimensional error. For sensing thin substrates such as wafers, reflection sensors of limited reflection type are used, in which a spot light of extremely small diameter is projected from the reflection sensor, so that wafers opposite and spaced from the sensor are detected. Even so, when the wafer is offset in the rack member in either one of forward and backward directions, or when the end surface processing of the wafer has been insufficient, even the reflection sensor of the limited reflection type can often make an error.

SUMMARY OF THE INVENTION

In view of the foregoing, it is an object of the present invention to provide a method and a simple mechanism for sensing substrates within a container reliably at high speed without using the substrate transferring system.

To accomplish the above object, the present invention provides a substrate detection device incorporated in a sealed container for storing therein and transferring a plurality of substrates. The sealed container includes a container housing, a removable front door, and a door moving mechanism including a door fixing unit for fixedly holding the front door, and a lifting block operatively connected to the door fixing unit for moving the door fixing unit upward and downward so as to open and close the container housing with the front door. The substrate detection device of the present invention preferably includes: a pair of gear wheels rotatably supported in mutual engagement for synchronous rotation and accommodated within a recess in the door fixing unit at a position near an upper end thereof; a pair of support arms attached to the pair of gear wheels respectively at base ends thereof; a sensor comprising a light-transmitting unit and a light-receiving unit which are respectively mounted at distal ends of the pair of support arms; a cam member rotatably mounted on the door fixing unit and connected to one of the pair of gear wheels such as to transmit rotation thereto; a cam groove formed in the cam member; and a cam follower mounted on a stationary part of the door moving mechanism at a position where it engages with the cam groove when the cam member is lowered integrally with the door fixing unit.

Preferably, the cam groove is configured such that the engagement between the cam follower and the cam groove causes rotation of the gear wheels, whereby the support arms are rotated into the sealed container and located on both sides of an uppermost substrate within the sealed container.

In one preferred embodiment of the present invention, the cam follower is attached on an actuator mounted on the stationary part of the door moving mechanism so that the cam follower is advanced forward to engage with the cam groove and retracted backward to disengage therefrom.

In another preferred embodiment of the present invention, the cam groove comprises a curved first track and a linear second track, the cam follower being engaged with the first track when the cam member is lowered integrally with the door fixing unit, and engaged with the second track when the cam member is lifted integrally with the door fixing unit.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF PREFERRED EMBODIMENTS

Figure 1:
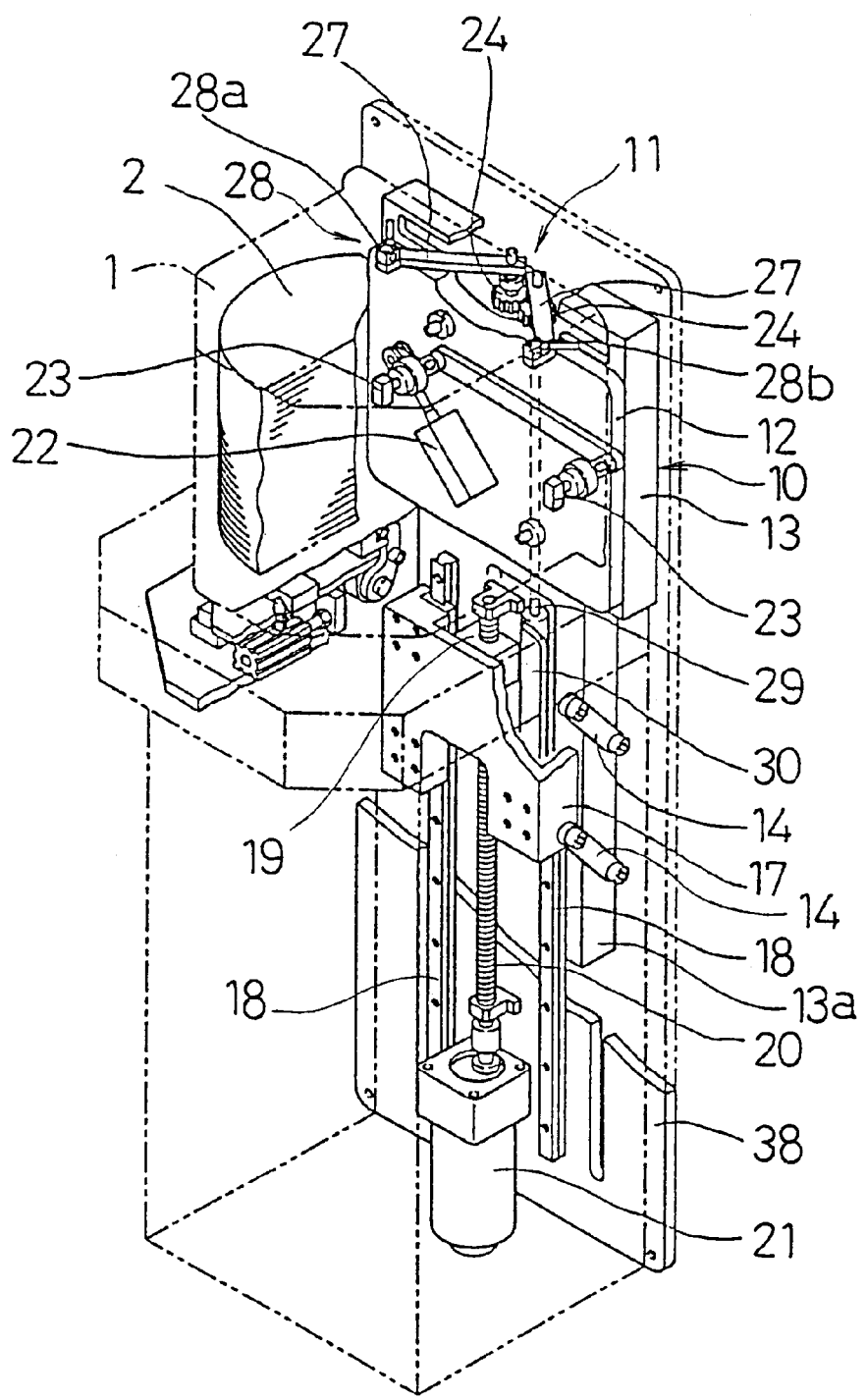
FIG. 1 is a perspective view showing a door moving mechanism of a sealed container equipped with a substrate detection device according to one embodiment of the present invention.

FIG. 1 shows a door moving mechanism 10 equipped with a substrate detection device 11 according to one embodiment of the present invention. The substrate detection device 11 of the present invention is operatively connected to a conventional door moving mechanism 10, which is generally termed a "FOUP front opener", of a sealed container 1.

The sealed container 1 includes a housing with a port on the front side for providing access to the interior thereof, and accommodates therein a predetermined number of substrates 2 to which film forming process is to be performed. A front door 12 is movable between a closed position overlying the port and an open position spaced from the port by means of a pair of latch members 23. A suitable seal such as an O-ring (not shown) is interposed between the front door 12 and the port for sealing the interior of the container from the surrounding atmosphere when the front door 12 is in the closed position.

The door moving mechanism 10 includes a door fixing unit 13 fixed to the front door 12 for causing the front door 12 to be locked with and released from the container port, and a lifting block 17 connected to an extension 13a of the door fixing unit 13 therebelow via a pair of links 14. The lifting block 17 is supported on both sides and moved along a pair of linear motor guide rails 18, and driven by a motor 21. The motor 21 rotates a ball screw 20, on which a nut 19 fixedly connected to the lifting block 17 is screwed. When the lifting block 17 is lowered, the door fixing unit 13 is first moved horizontally backwards in relation to the container 1 by a rotational movement of the pair of links 14, after which it is lowered integrally with the lifting block 17.

The door fixing unit 13 includes a latch rotating cylinder 22 for rotating the pair of latch members 23 at 90 degrees in the forward and reverse directions so as to position the latch members 23 at the locking position and the release position. When the latch members 23 are vertically oriented, the front door 12 is closed and locked with the seal interposed between the front door 12 and the port of the container 1. When the latch members 23 are rotated at 90 degrees from the position illustrated in the drawing and are horizontally oriented, the front door 12 is unlocked and capable of removing from the port, as well as fixed to the door fixing unit 13. The above described door moving mechanism 10 is constructed substantially the same as a well-known, general FOUP front opener.

Figure 2:
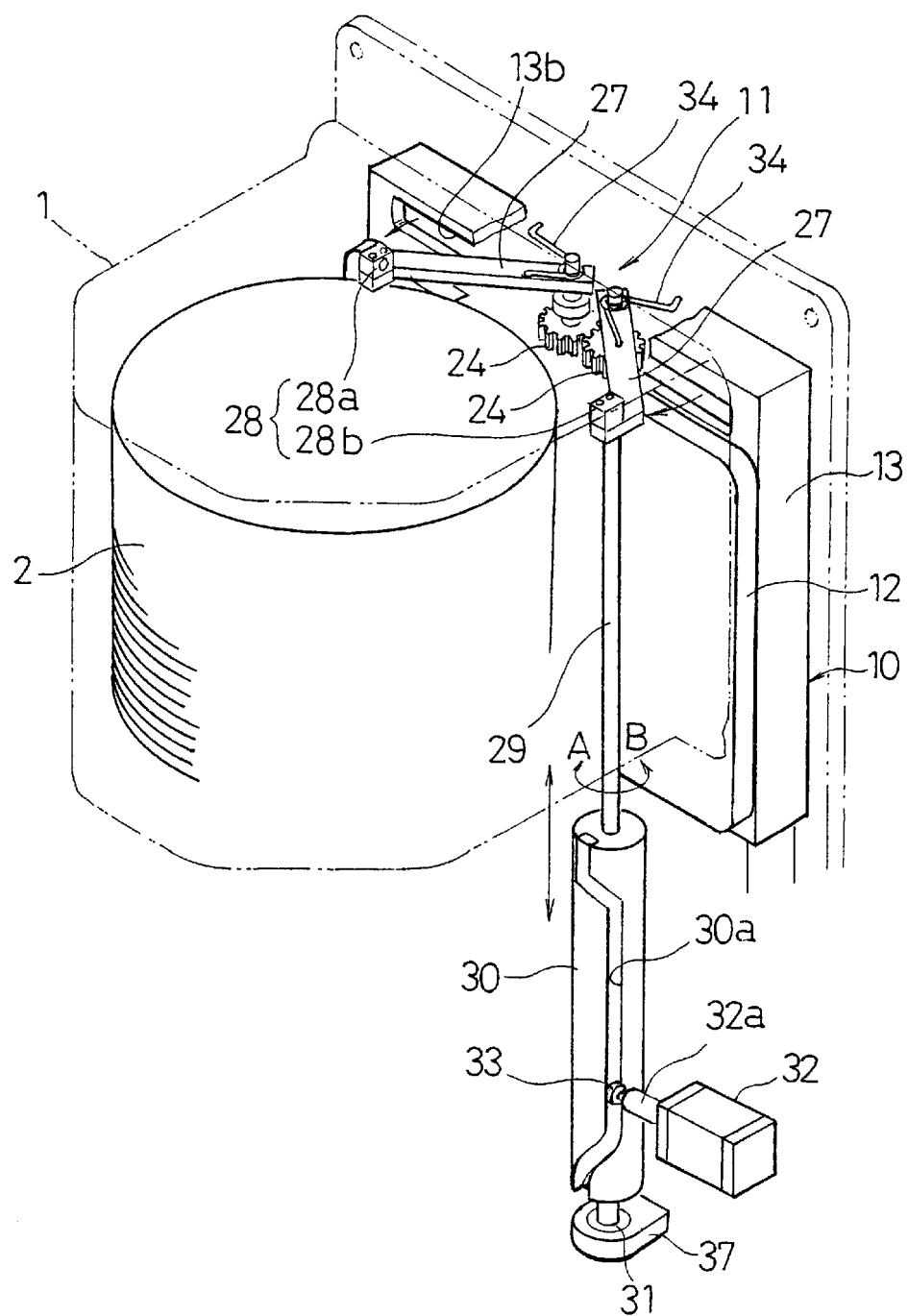
FIG. 2 is a perspective view showing to a larger scale the substrate detection device in the door moving mechanism.

With reference to FIG. 2 which shows to a larger scale the substrate detection device 11 operatively connected to the door moving mechanism 10, the door fixing unit 13 is formed with an elongated slit 13b extending horizontally near its top end, and a pair of identical spur gears 24 meshing each other are supported rotatably in the middle of this elongated slit 13b. A pair of support arms 27 of the same length are fixed at base ends thereof to the pair of spur gears 24 respectively, so that they are rocked in synchronism with each other as the spur gears rotate. A light transmission unit 28a and a light receiving unit 28b, constituting a transmission sensor 28, are respectively attached to the distal ends of the support arms 27. A pair of torque springs 34 are provided to each of the support arms 27 for biasing them to rotate in mutually opposite directions.

The substrate detection device 11 is operatively connected to the door moving mechanism 10 via a rotary shaft 29 and a cylindrical cam 30. The upper end of the rotary shaft 29 is coaxially fixed to one of the pair of the spur gears 24. The lower end of the rotary shaft 29 is connected to the upper end of the cylindrical cam 30 in coaxial relative arrangement. The cylindrical cam 30 is rotatably supported by a bearing 31 at its lower end. A cam groove 30a of predetermined configuration is formed in the cylindrical cam 30 as shown in FIG. 2, and a cam follower 33 is engaged to and disengaged from this cam groove 30a. The cam follower 33 is attached to the distal end of a piston rod 32a of a cam follower actuating cylinder 32, so that it can be moved to an engaged position where it engages with the cam groove 30a and a retracted position. The bearing 31 is supported on a fixed block 37 mounted on the extension 13a of the door fixing unit 13. Thus, the rotary shaft 29 and the cylindrical cam 30 connected thereto are rotatably supported on the door fixing unit 13 by one of the spur gears 24 and the bearing 31, and moved integrally with the door fixing unit 13. The cam follower actuating cylinder 32 is mounted on a stationary base plate 38.

The substrate detection device 11 detects the substrates 2 within the sealed container 1 successively as the front door 12 is opened by the door moving mechanism 10. When the sealed container 1 is transferred to a predetermined position in relation to the door moving mechanism 10, and its front door 12 pressed against the door fixing unit 13 of the door moving mechanism 10, the pair of latch members 23 attached to the front door 12 are inserted through corresponding slots (not shown) into the sealed container 1. The cylinder 22 provided on the door fixing unit 13 causes its piston rod to advance forward, so that the pair of latch members 23 rotate at 90 degrees from their vertically oriented positions to horizontally oriented positions. In this way, the front door 12 is released from engagement with the main body of the sealed container 1, and at the same time locked to the door fixing unit 13.

The cam follower actuating cylinder 32 causes the piston rod 32a to advance upon input of a signal instructing the front door 12 to open, so that the cam follower 33 at the distal end of the piston rod 32a is located in a position at which it will be able to engage with the cam groove 30a when the cylindrical cam 30 is lowered. At this time point, however, the cam follower 33 is not facing but located downwardly apart from the cam groove 30a.

When the front door 12 is locked to the door fixing unit 13 as described above, the motor 21, which is a drive source of the door moving mechanism 10, is driven so as to rotate the ball screw 20. The lifting block 17, with its nut 19 being screwed on the ball screw 20, starts to move downwards as the ball screw 20 rotates. The door fixing unit 13 is connected to the lifting block 17 via a pair of links 14, which starts to rotate simultaneously with the downward movement of the lifting block 17, so that the door fixing unit 13 is horizontally moved backwards with respect to the sealed container 1. Thus the front door 12 which is locked to the door fixing unit 13 with the pair of latch members 23 is transferred horizontally apart from the sealed container 1.

When the front door 12 is completely separated from the sealed container 1, the links 14 reach their horizontal positions and stop the backward movement of the door fixing unit 13. At this time, the cylindrical cam 30 below the door fixing unit 13 is not yet lowered enough to allow the cam follower 33 to engage with the cam groove 30a.

After pausing, the door fixing unit 13 starts to move downward with the continuing downward movement of the lifting block 17. The cylindrical cam 30 is lowered integrally with the door fixing unit 13, and the cam follower 33 immediately engages with the lower end of the cam groove 30a formed in the cylindrical cam 30. As is clearly illustrated in FIG. 2, the cam groove 30a includes a curved portion in a lower part thereof, so that the cylindrical cam 30 is rotated in the direction of arrow A in FIG. 2 as it is lowered, by the engagement between the cam follower 33 and the cam groove 30a. This rotation of the cylindrical cam 30 in the direction of arrow A is transmitted to one of the spur gears 24 through the rotary shaft 29 integrally connected to the cylindrical cam, which in turn causes the pair of spur gears 24 engaging with each other to rotate in synchronism.

The pair of support arms 27 are thereby rotated respectively by the spur gears 24 in synchronism with each other, and moved from within the elongated slot 13b of the door fixing unit 13 to the inside in an upper part of the sealed container 1 as indicated by the arrows in FIG. 2. In this way, the light transmission unit 28a and the light receiving unit 28b of the transmission-type substrate detecting sensor 28 are positioned opposite each other on both sides of an uppermost substrate 2 within the sealed container 1 so that they can detect the presence of the substrate 2.

The timing at which the light transmission unit 28a and the light receiving unit 28b come out of the elongated slot 13b and move toward inside of the sealed container 1 is determined by the time point at which the cam follower 33 passes along the curve in the lower part of the cam groove 30a. In other words, the light transmission unit 28a and the light receiving unit 28b are inserted into the sealed container 1 as soon as the front door 12 has been lowered enough to allow the support arms 27 to enter between the upper end of the front door 12 and the interface port of the sealed container 1. Since this is mechanically achieved, any sensors for detecting positions of the relevant members and the like are not necessary.

The positions of the light transmission unit 28a and the light receiving unit 28b facing each other within the sealed container 1 are determined by the length of the curved portion of the cam groove 30a in the lower part thereof. Furthermore, the light transmission unit 28a and the light receiving unit 28b are operatively connected to the door moving mechanism 10 so that the positioning thereof toward inside the sealed container 1 is achieved mechanically by the single pair of spur gears 24 and the single pair of support arms 27 which are rotated as the door moving mechanism 10 is lowered. Thus the light transmission unit 28a and the light receiving unit 28b are positioned in an appropriate relative relationship with each other within the sealed container 1 without using any position detecting sensors and the like.

The substrate detection sensor 28 is of a light transmission design, wherein it determines the presence of a substrate based upon whether the light projected from the light transmission unit 28a has been received by the light receiving unit 28b. Therefore, even if the rack members within the sealed container 1 are displaced or the substrates 2 are not properly accommodated in their positions, or even if the substrates 2 have not been subjected to an end surface process, the substrate detection sensor 28 is capable of detecting the substrates without errors. Moreover, the light transmission unit 28a and the light receiving unit 28b are arranged such that they face each other on a plane which is slightly inclined with respect to a horizontal plane. In this way, it is ensured that even a thin wafer can be detected, because the light projected from the light transmission unit 28a toward the light receiving unit 28b will be blocked by the intervening substrate 2 therebetween. After being located in their predetermined positions within the sealed container 1, the light transmission unit 28a and the light receiving unit 28b are lowered integrally with the door fixing unit 13 with their relative positions being maintained, as the cam follower 33 slides along the linear portion of the cam groove 30a shown in FIG. 2. Thus the substrates 2 within the sealed container 1 are successively detected from top to bottom as the front door 12 is lowered to open the sealed container 1.

After the substrate detection sensor 28 has detected the lowermost substrate 2 in the sealed container 1, the cylindrical cam 30 is further lowered so that the cam follower 33 slides along a curve in an upper part of the cam groove 30a, causing the cylindrical cam 30 to rotate in the direction of arrow B in FIG. 2. This rotation of the cylindrical cam 30 in the direction of arrow B causes the pair of support arms 27 to rotate synchronously in opposite directions, so that the light transmission unit 28a and the light receiving unit 28b attached at their distal ends are accommodated within the elongated slot 13b of the door fixing unit 13. As will be understood, the curves in the upper and lower parts of the cam groove 30a have the same length and are turned at the same angle in opposite directions.

Figure 4:
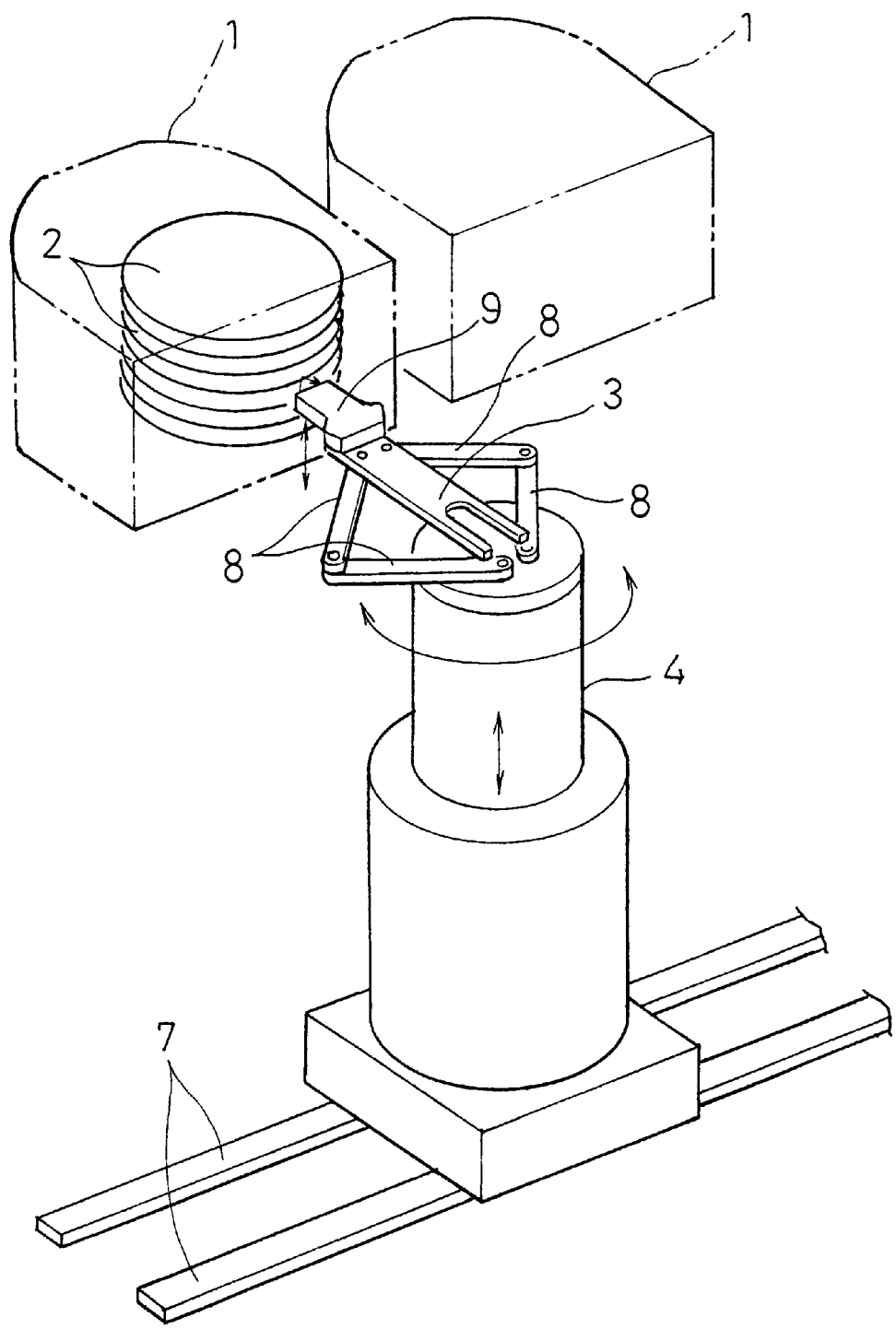
FIG. 4 is a perspective view showing a conventional substrate detection means.

Meanwhile, the door fixing unit 13 is further lowered after the substrate detection sensor 28 has been accommodated within the slot 13b. When the upper end of the front door 12 comes to a position slightly lower than the bottom of the port of the sealed container 1, i.e., when the front door 12 is lowered enough to completely open the port of the sealed container 1, the motor 21 is stopped and the door fixing unit 13 comes to a halt. In this state, each of the substrates 2 within the sealed container 1 is transferred to a film forming system by a substrate handling robot 4 such as the one shown in FIG. 4, subjected to a predetermined film forming process, and brought back into the respective rack members in the sealed container 1 by the substrate handling robot 4.

As described above, the substrate detection device 11 itself has no power source, nor any additional sensors other than the substrate detection sensor 28, but is simply connected to the door moving mechanism 10 operatively, so that it detects the substrates 2 swiftly with the action of the door moving mechanism 10 which is driven by the single motor 21. Moreover, since the substrate detection sensor 28 is of a light transmission design and their light transmission unit 28a and light receiving unit 28b are arranged slightly offset in a vertical direction as described above, it is capable of detecting the substrates 2 without failure irrespective of dimensional errors in the rack members or misalignment of the substrates 2.

Since the substrate detection device 11 is operatively connected to the door moving mechanism 10, the substrate handling robot 4 is used exclusively for its intended purpose of transferring substrates. Therefore, the transfer efficiency of the substrates 2 is remarkably enhanced, and various problems such as shortened life of the substrate transfer system, transfer troubles of substrates, and product defects due to dust, which were all attributable to excessive use of the substrate handling robot, can be solved.

After the substrates 2 have been processed and when they are brought back into the container, it is no more necessary to detect the substrates. If the substrate detection sensor 28 is made to perform such detecting action as described in the foregoing also in its way back to the initial position, it may cause generation of dust, leading to other troubles such as product defects etc. Therefore, the substrate detection device 11 of the present invention is designed such as not to perform unnecessary detecting action when the sealed container 1 is closed with the door moving mechanism 10.

As described above, the cam follower 33 is attached on the distal end of the piston rod 32a of the cam follower actuating cylinder 32 that is advanced to and retracted from the cylindrical cam 30, so it can be readily disengaged from the cam groove 30a. During the front door 12 of the sealed container 1 is being opened, the actuating cylinder 32 holds the piston rod 32a in an advanced position, so that the cam follower 33 keeps engaging with the cam groove 30a. When a signal instructing the sealed container 1 to be closed is inputted, the actuating cylinder 32 causes the piston rod 32a to be retracted, and the cam follower 33 to be moved backwards to a position where it no longer engages with the cam groove 30a of the cylindrical cam 30, which will be lifted together with the closing front door 12. At this time, the pair of support arms 27 are biased with respective torque springs 34 towards a direction in which the substrate detection sensor 28 attached at their distal ends is kept accommodated within the elongated slot 13b of the door fixing unit 13.

When closing the sealed container, the motor 21 is rotated in a reverse direction so as to lift the lifting block 17. The door fixing unit 13 connected to the lifting block 17 via the pair of links 14, and the front door 12 fixed thereto, are lifted integrally with the lifting block 17. The cylindrical cam 30 which is also lifted with the door fixing unit 13 is not rotated this time, because the cam follower 33 has been disengaged from the cam groove 30a. Thus the substrate detection sensor 28 remains accommodated within the elongated slot 13b during it is lifted by means of the door moving mechanism 10.

When the door fixing unit 13 is lifted to its upper limit position, the front door 12 comes to face the sealed container 1 where it can be locked thereto. The front door 12 is pressed against the front port of the sealed container and locked thereto with the latch members 23 in reverse sequence of the door opening operation described in the foregoing. As described above, the substrate detection device 11 of the present invention does not perform any unnecessary detecting action within the sealed container 1 when the front door 12 is being closed. The front door 12 is closed at high speed accordingly, and no dust generated, whereby the reliability is improved.

It should be noted that, although in the foregoing embodiment the cam follower 33 is attached at the distal end of a piston rod 32a of a cylinder 32 to be retractably advanced to the cam groove 30a so as to engage therewith and disengage therefrom, the arrangement for moving the cam follower 33 may be linkages or may be solenoid operated or may be of other appropriate design.

Figure 3A:
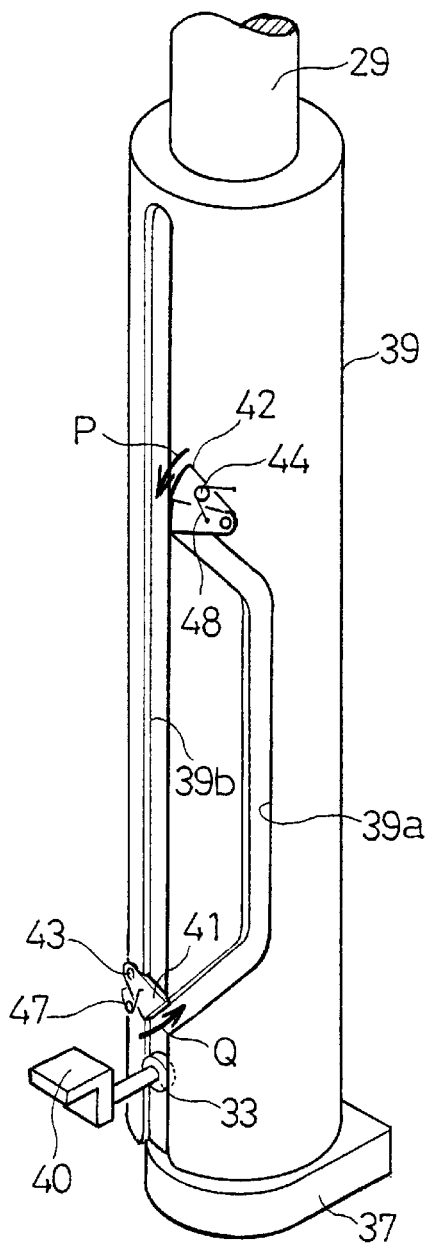
FIG. 3A is a perspective view showing a cylindrical cam and a cam follower in the substrate detection device according to another embodiment of the present invention.
Figure 3B:
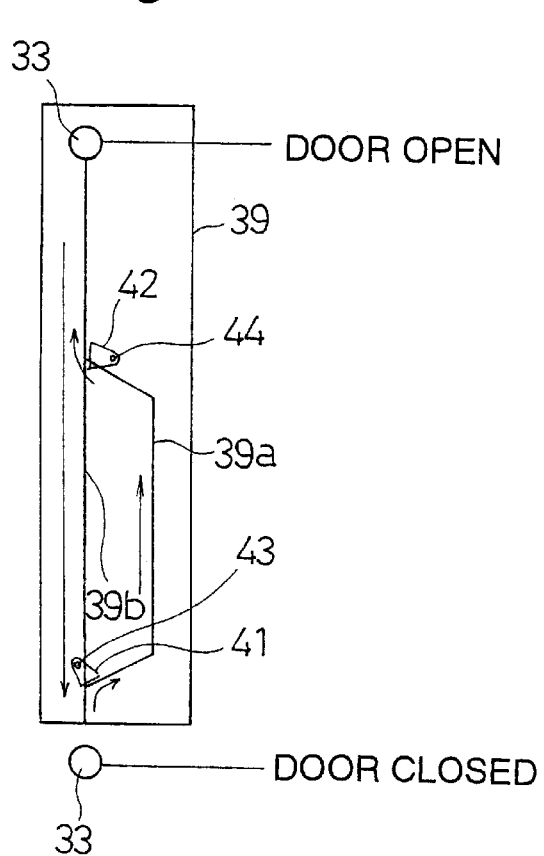
FIG. 3B is a diagram given in explanation of the relationship between the cam groove of the cylindrical cam and the cam follower engaged therewith.

FIGS. 3A and 3B show a cylindrical cam with cam grooves and a cam follower of a substrate detection device according to another embodiment of the present invention. The elements which are identical or similar to those of the first embodiment described above are given the same reference numerals, and the description thereof will be omitted. In the substrate detection device of this embodiment, as compared to that of the first embodiment, the cylindrical cam has a different cam track, and the cam follower is fixed in position. Other arrangements are substantially the same as those shown in FIGS. 1 and 2.

The cylindrical cam 39 in this embodiment includes a first cam groove 39a bent in the form of letter U slightly spread out similarly to the cam groove 30a of the cylindrical cam 30 in the first embodiment, and a second cam groove 39b which extends linearly from the corner at the bottom of the first cam groove 39a to the upper end of the cylindrical cam 39. The second cam groove 39b communicates with the first cam groove 39a at two points in upper and lower parts as shown in FIGS. 3A and 3B. The cam follower 33 has the same shape as that of the first embodiment, but is fixedly connected to a stationary bracket 40 instead of the retractable piston rod 32a of the cam follower actuating cylinder 32. The stationary bracket 40 is attached to the base plate 38 shown in FIG. 1. The cam follower 33 is fixed to the bracket 40 in a position such as to be able to engage with either of the cam grooves 39a, 39b as the cylindrical cam 39 moves upwards and downwards.

At the upper and lower junctions between the two cam grooves 39a and 39b, a first and a second piece of plates 41, 42 are provided rotatably around respective support pins 43, 44, for restricting the tracking direction of the cam follower 33. The first restriction plate 41 at the lower junction is biased with a torque spring 47 towards the direction of arrow Q in FIG. 3A to contact a stopper (not shown), so that it blocks communication between the first cam groove 39a and the second cam groove 39b. The second restriction plate 42 is biased with a torque spring 48 towards the direction of arrow P in FIG. 3A to contact a stopper (not shown), so that it blocks communication of the first cam groove 39a with the second cam groove 39b. The torque springs 47, 48 exert a biasing force to the first and second restriction plates 41, 42, which is sufficiently smaller than the driving force of the cam follower 33 tracking each of the cam grooves 39a, 39b. Therefore, when the cam follower 33 sliding in the cam grooves comes to contact either one of the restriction plates 41, 42, it pushes them open against the biasing force of the torque springs 47, 48.

In the foregoing first embodiment, control is effected to engage or disengage the cam follower 33 to/from the cam groove 30a in accordance with the opening/closing action of the front door 12. In this embodiment, while the cam follower 33 does not retract, it is made to engage with either of the first and second cam grooves 39a and 39b switchably in accordance with the opening or closing movement of the front door 12 by means of the first and second restriction plates 41, 42. This is described in more detail with reference to FIG. 3B which illustrates the relative positions of the cam follower 33 and the cylindrical cam 39.

Although the cam follower 33 is stationary, while the cylindrical cam 39 is moved upwards and downwards by the door moving mechanism 10 as described above, because of the ease of explanation, the cam follower 33 is shown as a moving member and the cylindrical cam 39 a stationary member in FIG. 3B. When the sealed container 1 is closed with the front door 12, the cam follower 33 is located at a position below the cylindrical cam 39 as shown in FIG. 3B, opposite but downwardly apart from the bottom end of the first cam groove 39a. As the front door 12 begins to open by the door moving mechanism 10, the cylindrical cam 39 is lowered, and soon the cam follower 33 is brought into engagement with the bottom end of the first cam groove 39a.

The cam follower 33 tracks the first cam groove 39a with the downward movement of the cylindrical cam 39, and when it reaches the lower junction between the first and second cam grooves 39a, 39b, it turns right as indicated by an arrow in the drawing along the first curve in the groove, guided by a surface of the first restriction plate 41 which is blocking the straight path of the second cam groove 39b. The first cam groove 39a is formed with bent corners similarly to the cam groove 30a of the first embodiment as noted above, so as to cause the cylindrical cam 39 to rotate at a predetermined angle in a forward direction as the cam follower 33 tracks the cam groove 39a, whereby the substrate detection sensor 28 consisting of the light transmission unit 28a and the light receiving unit 28b is inserted within the sealed container 1 and detects the substrates 2.

As the cylindrical cam 39 continues to move downwards, the cam follower 33 slides into the second curve in the upper part of the cam groove 39a toward the upper junction between the first and second cam grooves 39a, 39b. When the cam follower 33 tracks the upper curve in the first cam groove 39a, the cylindrical cam 39 is rotated at a predetermined angle in a reverse direction, so that the light transmission unit 28a and the light receiving unit 28b of the substrate detection sensor 28 are accommodated within the slit 13b of the door fixing unit 13.

When the cam follower 33 comes to contact the second restriction plate 42 at the upper junction between the two cam grooves 39a, 39b, because the restriction plate 42 is biased in the direction of arrow P with the torque spring 48 with a smaller force than the driving force of the cam follower 33, the cam follower 33 pushes the restriction plate 42 aside, proceeds forward into the second cam groove 39b, and further tracks the second cam groove 39b upwards. As the front door 12 is completely opened by the door moving mechanism 10 with the cylindrical cam being located at its lower limit position, the cam follower 33 comes to a halt at its upper limit position at the top end of the second cam groove 39b as illustrated in FIG. 3B. After the cam follower 33 has passed therethrough, the second restriction plate 42 is returned to its initial position by the biasing force of the torque spring 48.

When the sealed container 1 is closed with the front door 12 by means of the door moving mechanism 10, as the cylindrical cam 39 is lifted upwards, the cam follower 33 tracks the second cam groove 39b from its top end downwards. When it comes to the upper junction between the first and second cam grooves 39a, 39b, the cam follower 33 continues to slide straight in the second cam groove 39b, guided by a surface of the second restriction plate 42 which is blocking the communication between the two cam grooves 39a, 39b. When the cam follower 33 comes to contact the first restriction plate 41 at the lower junction between the two cam grooves 39a, 39b, because the restriction plate 41 is biased in the direction of arrow Q with the torque spring 47 with a smaller force than the driving force of the cam follower 33, the cam follower 33 pushes the restriction plate 41 aside, proceeds forward back into the first cam groove 39a, and further tracks the first cam groove 39a downwards. After the cam follower 33 has passed therethrough, the first restriction plate 41 is returned to its initial position by the biasing force of the torque spring 47.

During the front door 12 is being lifted upwards to close the sealed container 1, the cylindrical cam 39 is subject to a torque transmitted thereto from the torque springs 34 attached to the support arms 27 through the rotary shaft 29 in the direction of arrow B in FIG. 1. Accordingly, when the cam follower 33 slides in the second cam groove 39b, it remains pressed against the cam surface on the side opposite from the first cam groove 39a (left hand side in FIG. 3A). In this way, the cam follower 33, when it slides downwards in the second cam groove 39b, is prevented from entering the first cam groove 39a at the upper and lower junctions between the two cam grooves 39a, 39b.

Thus, when closing the sealed container 1 with the front door 12, the cam follower 33 is caused to track only the linear second cam groove 39b, and the cylindrical cam 39 is not rotated. Therefore, the light transmission unit 28a and the light receiving unit 28b of the substrate detection sensor 28 are kept accommodated within the slot 13b of the door fixing unit 13 by the biasing force of the torque springs 34. In this embodiment, the cam follower actuating cylinder 32 of the first embodiment is thus eliminated, while achieving the same control of the substrate detection sensor 28 not to perform the detection of substrates while the sealed container 1 is being closed with the front door 12.

While one example was given in the foregoing embodiment wherein a cylindrical cam 30 is adopted for operatively connecting the pair of support arms 27 to the door moving mechanism 10, plate cams can be employed instead, and any other means can be used as long as it connects the support arms 7 operatively to the door moving mechanism 10 for enabling the light transmission unit 28a and the light receiving unit 28b at the distal ends of a pair of support arms 27 to be inserted into predetermined positions within the sealed container 1.

Although in the above described preferred embodiments, the sealed container 1 is described as being specifically designed for use with 300 mm diameter wafers, it should be understood that the substrate detection device of the present invention can be applied to other types of substrate containers used in mini-environments for handling various other substrates such as semiconductor elements, liquid crystal display panels, thin film devices for constituting solar cells, and magnetic heads, etc. In short, the substrate detection device of the present invention may be adopted to any type of containers having a door to be opened and closed with respect to the container housing, as long as it is operatively connected to the door moving mechanism of the container.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A substrate detector installed in a sealed container for storing therein and transferring a plurality of substrates, said substrate detector being operatively connected to a door fixing unit for moving a front door of the sealed container in directions to and from the sealed container and in vertical directions so as to open the sealed container and to close the sealed container with the front door, comprising:
   a support arm mounted on the door fixing unit;
   a sensor mounted at a distal end of the support arm;
   a rotation transmitting member mounted rotatably at an upper end of the door fixing unit for supporting a base end of the support arm and for transmitting rotation thereof to the support arm; and
   a linkage connected to the rotation transmitting member for rotating the rotation transmitting member at a predetermined angle, said rotation of the rotary transmitting member at the predetermined angle causing the support arm to be inserted into the sealed container and to be located in a predetermined position with respect to the substrates within the sealed container.

2. The substrate detector according to claim 1, wherein the sensor comprises a light transmission unit and a light receiving unit, and the support arm is provided in a pair, with said light transmission unit and said light receiving unit being mounted at respective distal ends of the pair of support arms.

3. The substrate detector according to claim 2, wherein the rotation transmitting member is a pair of spur gears in mutual engagement for synchronous rotation, said pair of spur gears respectively supporting the base ends of each one of said pair of support arms, so that when rotation is transmitted to the pair of spur gears, the pair of support arms are rotated by the synchronous rotation of the spur gears and inserted into the sealed container and located on both sides of the substrates.

4. The substrate detector according to claim 3, wherein the pair of support arms are respectively provided with a biasing member for providing a torque in a direction in which said support arms are accommodated within a recess formed in the door fixing unit.

5. The substrate detector according to claim 1, wherein the linkage comprises a rotary shaft coaxially connected to said rotation transmitting member, a cam member connected to said rotary shaft and rotatably supported on the door fixing unit, a cam groove of predetermined configuration formed in said cam member, and a cam follower for engagement with said cam groove of the cam member, wherein said rotation transmitting member is rotated at said predetermined angle by the engagement of said cam follower with the cam groove of the cam member.

6. The substrate detector according to claim 1, wherein said linkage comprises a rotary shaft coaxially connected to said rotation transmitting member, a cylindrical cam coaxially connected at an upper end thereof to said rotary shaft and rotatably supported at a lower end thereof on the door fixing unit, a cam groove formed on a circumferential surface of said cylindrical cam, and a cam follower located at a position where it engages with said cam groove when the cylindrical cam is lowered integrally with the door fixing unit.

7. The substrate detector according to claim 6, wherein said cam follower is mounted on an actuator which causes the cam follower to move forward and backward so as to engage with and disengage from the cam groove of the cylindrical cam.

8. The substrate detector according to claim 6, wherein said cam groove is formed so as to rotate said cylindrical cam in a forward direction at an angle for causing said sensor at the distal end of the support arm to be positioned on both sides of the substrates within the sealed container at a time point immediately after the door fixing unit has started lowering, and to rotate said cylindrical cam in a reverse direction at same angle at a time point when all of the substrates within the sealed container have been detected by said sensor.

9. The substrate detector according to claim 6, wherein said cam groove of the cylindrical cam comprises a first cam groove formed so as to rotate said cylindrical cam in a forward direction at an angle for causing said sensor at the distal end of the support arm to be positioned on both sides of the substrates within the sealed container at a time point immediately after the door fixing unit has started lowering, and to rotate said cylindrical cam in a reverse direction at same angle at a time point when all of the substrates within the sealed container have been detected by said sensor, and a second cam groove formed linearly so as not to rotate the cylindrical cam during the door fixing unit is lifted.

10. The substrate detector according to claim 9, wherein said first cam groove and said second cam groove are joined at two locations, with restriction plates being rotatably mounted and biased in one direction at said two joint locations so as to switchably change the cam grooves with which the cam follower engages.

11. The substrate detector according to claim 10, wherein said restriction plates switch the cam grooves such that the cam follower tracks the first cam groove during the door fixing unit is lowered and that the cam follower tracks the second cam groove during the door fixing unit is lifted.

12. A method of detecting substrates accommodated within a sealed container having a removable front door, comprising:

positioning the sealed container with respect to a door moving mechanism for opening and closing the front door;

releasing a lock between the front door and the sealed container and moving the front door a fixed distance in a backward direction with respect to the sealed container by the door moving mechanism;

moving the front door in a direction orthogonal to said backward direction with respect to the sealed container by the door moving mechanism;

inserting a sensor into the sealed container and positioning the sensor at a location where the sensor is capable of detecting the substrates within the sealed container at a time point when the front door has been moved a predetermined distance away from the sealed container;

detecting the presence and position of each of the substrates with the sensor successively as the front door is moved away from the sealed container; and retracting the sensor out of the sealed container when all of the substrates within the sealed container have been detected by the sensor, and wherein the sensor is operatively connected to the door moving mechanism so that the sensor is inserted into and retracted out of the sealed container with a same drive source for driving the door moving mechanism for opening and closing the front door.

13. A method of detecting substrates accommodated within a sealed container having a removable front door, comprising:

positioning the sealed container with respect to a door moving mechanism for opening and closing the front door;

releasing a lock between the front door and the sealed container and moving the front door a fixed distance in a backward direction with respect to the sealed container by the door moving mechanism;

moving the front door in a direction orthogonal to said backward direction with respect to the sealed container by the door moving mechanism;

inserting a sensor into the sealed container and positioning the sensor at a location where the sensor is capable of detecting the substrates within the sealed container at a time point when the front door has been moved a predetermined distance away from the sealed container;

detecting the presence and position of each of the substrates with the sensor successively as the front door is moved away from the sealed container; and retracting the sensor out of the sealed container when all of the substrates within the sealed container have been detected by the sensor, and wherein the sensor is operatively connected to the door moving mechanism through a cam member having a cam groove of predetermined configuration and a cam follower that tracks said cam groove, one of said cam member and the cam follower being movable integrally with the door moving mechanism and the other being stationary.

14. A sealed container for storing therein and transferring a plurality of substrates, comprising:

a container housing;

a removable front door;

a door moving mechanism including a door fixing unit for fixedly holding the front door, a lifting block operatively connected to the door fixing unit for moving the door fixing unit upward and downward so as to open the container housing and to close the container housing with the front door;

a pair of gear wheels rotatably supported in mutual engagement for synchronous rotation and accommodated within a recess in the door fixing unit at a position near an upper end thereof;

a pair of support arms attached to said pair of gear wheels respectively at base ends thereof;

a sensor comprising a light transmission unit and a light receiving unit which are respectively mounted at distal ends of the pair of support arms;

a cam member rotatably mounted on said door fixing unit and connected to one of said pair of gear wheels such as to transmit rotation thereto;

a cam groove formed in said cam member; and a cam follower mounted on a stationary part of the door moving mechanism at a position where it engages with said cam groove when the cam member is lowered integrally with the door fixing unit.

15. The sealed container according to claim 14, wherein the engagement between said cam follower and said cam groove causes rotation of said gear wheels, whereby the support arms are rotated into the sealed container and located on both sides of an uppermost substrate within the sealed container.

16. The sealed container according to claim 14, wherein the cam follower is attached on an actuator mounted on the stationary part of the door moving mechanism so that the cam follower is advanced forward to engage with the cam groove and retracted backward to disengage therefrom.

17. The sealed container according to claim 14, wherein the cam groove comprises a curved first track and a linear second track, the cam follower being engaged with said first track when the cam member is lowered integrally with the door fixing unit, and engaged with said second track when the cam member is lifted integrally with the door fixing unit.

* * * * *